(12) United States Patent
Fujimori et al.

(10) Patent No.: US 6,674,109 B1
(45) Date of Patent: Jan. 6, 2004

(54) NONVOLATILE MEMORY

(75) Inventors: Yoshikazu Fujimori, Kyoto (JP); Takashi Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 25 days.

(21) Appl. No.: 10/070,977
(22) PCT Filed: Sep. 28, 2000
(86) PCT No.: PCT/JP00/06734
§ 371 (c)(1),
(2), (4) Date: Mar. 13, 2002
(87) PCT Pub. No.: WO01/24265
PCT Pub. Date: Apr. 5, 2001

(30) Foreign Application Priority Data

Sep. 30, 1999 (JP) .......................... P.11-280236

(51) Int. Cl.⁷ .............................. H01L 29/76
(52) U.S. Cl. ................. 257/295; 257/316; 365/145
(58) Field of Search .............. 257/295, 316, 257/410, 411; 365/145

(56) References Cited

U.S. PATENT DOCUMENTS

| 5,619,051 A | 4/1997 | Endo |
| 6,215,646 B1 * | 4/2001 | Ochiai et al. ............ 361/301.4 |
| 6,229,166 B1 * | 5/2001 | Kim et al. ................. 257/295 |

FOREIGN PATENT DOCUMENTS

| EP | 0 940 856 A1 | 9/1999 |
| JP | 6-13542 | 1/1994 |
| JP | 7-161833 | 6/1995 |
| JP | 7-297302 | 11/1995 |
| JP | 8-8407 | 1/1996 |
| JP | 8-17678 | 1/1996 |
| JP | 9-51074 | 2/1997 |
| JP | 10-4181 | 1/1998 |
| JP | 11-103027 | 4/1999 |
| JP | 11-204746 | 7/1999 |

OTHER PUBLICATIONS

English language translation of Japanese Kokai 7–297302 (Nishikawa).*
English language translation of Japanese Kokai 10–4181 (Yokoyama et al.).*

* cited by examiner

Primary Examiner—Mark V. Prenty
(74) Attorney, Agent, or Firm—Morgan, Lewis & Bockius LLP

(57) ABSTRACT

An object of the invention is to decrease leakage current of a nonvolatile memory and to design improvement of memory characteristic thereof. The invention is characterized by comprising an FET of MFMIS structure having metal layer (M) and insulation layer (I) on boundary of a ferroelectrics and a semiconductor as a buffer layer, and further by letting an insulation barrier layer between a floating gate or a control gate and a ferroelectric layer.

21 Claims, 3 Drawing Sheets

NONVOLATILE MEMORY

TECHNICAL FIELD

The present invention relates to a non-volatile memory, particularly to an MFSFET (Metal-Ferroelectrics-Semiconductor-Field Effect Transistor) type memory.

BACKGROUND OF THE INVENTION

Ferroelectrics researched now is divided largely in two. One is a type detecting reversion charge quantity of a ferroelectric capacitor and is constructed by a ferroelectric capacitor and a selecting transistor.

The other one is a memory detecting resistance change of a semiconductor caused by spontaneous polarization of ferroelectrics. The typical one of this type is MFSFET. This is an MIS structure using ferroelectrics at a gate insulation film. In this structure, it is needed to form directly ferroelectrics on a surface of a semiconductor, and it is very difficult to produce a memory element of good quality because boundary control of ferroelectrics and semiconductor is difficult. Although a memory structure providing a buffer layer at boundary of ferroelectrics and semiconductor is the main current now, we have proposed an FET of MFMIS structure set with a metal layer (M) and an insulation layer (I) at boundary of ferroelectrics/semiconductor as a buffer as shown in FIG. 4. The FET of MFMIS structure is constructed by laminating a gate oxide film 5, a floating gate 6, a ferroelectrics 7, a control gate 8 on a channel domain 4 formed between source drain domains 2 and 3 of a semiconductor substrate 1 in order.

In this structure, the semiconductor substrate 1 is usually grounded, and the ferroelectrics 7 generates polarization inversion by applying positive voltage to the control gate 8. Even if voltage of the control gate 8 is removed, negative charge generates at a channel forming domain CH by residual polarization of the ferroelectrics 7. This state is placed with the state of "1".

Conversely, by applying negative voltage to the control gate 8, the ferroelectrics 8 generates polarization inversion to reverse direction. Even if voltage of the control gate 8 is removed, positive charge generates at a channel forming domain CH by residual polarization of the ferroelectrics 8. This state is placed with the state of "0". Thus, writing data "1" or "0" to the FET can be carried out.

Reading the written data is carried out by applying reading voltage $V_r$ to the control gate. The reading voltage $V_r$ is set at value between threshold voltage $V_{th1}$ in the state "1" and threshold voltage $V_{th0}$ in the state "0". When voltage $V_r$ is applied to the control gate 8, whether written data is "1" or "0" can be judged by detecting whether drain current flows or not.

Thus, according to the FET of the MFMIS structure, one memory cell can be constructed with one element, and it becomes possible to carry out non-destructive reading excellently.

However, the FET of such the structure has the following problem. At writing, the FET has a form where a capacitor $C_f$ (capacitance is $C_f$) formed by the ferroelectric film 7 and a capacitor $C_{ox}$ (capacitance is $C_{ox}$) formed by the gate oxide film 5 (See FIG. 5). Therefore, when voltage V is applied between the substrate 1 and the control gate 8, voltage is divided in $V_f$ and $V_{ox}$ and is expressed by the following expression (1).

$$V = V_f + V_{ox}$$

$$C_f V_f = C_{ox} V_{ox} = q \quad (1)$$

q: generated charge quantity of the capacitor Therefore, divided voltage $V_f$ shown in the following expression is applied to the capacitor $C_f$ formed by the ferroelectric film 7.

$$V_f = V \cdot C_{ox}/(C_f + C_{ox}) \quad (2)$$

On the other hand, it needs to make $V_f$ high some degree in order to let the ferroelectric film 7 carry out polarization inversion at writing.

Therefore, it needs to make capacitance of the ferroelectric film to capacitance of the gate insulation film small. However, there is a problem that dielectric constant of PZT is about 200 to 1000 for example, so it is considerably higher than dielectric constant 3.9 of silicon oxide film constructing the gate insulation film.

Because of that, it is difficult to make $V_f$ high in the above expression (1). Therefore, there is a problem that polarization inversion of the ferroelectric film 7 at writing.

In order to solve the problem, it needs to make dielectric constant of the ferroelectric film as small as possible and make film thickness thin. Thus, although it is possible to make the divided voltage $V_f$ by making film thickness thin, on the other hand, as film thickness becomes thin, leakage current appears between the floating gate and the control gate, and that causes deterioration of memory characteristic.

The invention is carried out in view of the above-mentioned condition, and the object is to design decrease of leakage current and improvement of data holding characteristic of memory characteristic.

DISCLOSURE OF THE INVENTION

The invention is characterized by including FET of MFMIS structure letting metal layer (M) and insulator layer (I) stand at boundary of ferroelectric and semiconductor, and further by letting an insulation barrier layer between a floating gate or a control gate and a ferroelectric layer.

That is, a first memory of the invention is characterized by comprising an FET having MFMIS structure laminating in order a floating gate a ferroelectric layer, and a control gate on surface of a semiconductor substrate between source-drain domains formed on the surface of a semiconductor substrate through a gate insulation film, wherein the insulation barrier layer stands between said floating gate or said control gate and said ferroelectric layer.

According to such the construction, since the insulation barrier layer stands between the floating gate or the control gate and the ferroelectric layer, leakage current between the floating gate and the control gate is decreased and it is possible to obtain good memory characteristic.

The second invention is characterized in that said insulation barrier layer comprises insulation material including composition elements of said ferroelectric film in the nonvolatile memory according to the first invention.

According to such the construction, adding to effect by the above-mentioned first invention, because said insulation barrier layer includes composition elements of said ferroelectric film, diffusion of said elements from said ferroelectric film is prevented at use for long time and diffusion of composition elements from the insulation barrier layer too is prevented so as to design a long life.

In the third invention, said insulation barrier layer is characterized by standing between said ferroelectric layer and said control gate in the nonvolatile memory according to any of the first invention and the second invention.

By such the construction, since the insulation barrier layer may be formed on the upper surface of said ferroelectric film, the construction does not cause disturbing orientation at forming the ferroelectric film.

In the fourth invention, said insulation barrier layer is characterized by standing between said floating gate and said ferroelectric layer in the nonvolatile memory according to any of the first invention and the second invention.

By such the construction, when the insulation barrier layer stands between said floating gate and said ferroelectric layer, it is possible to construct with material narrowing difference of the lattice constant between that of said floating gate and that of said ferroelectric film.

Desirably, the invention is characterized in that said ferroelectric film is constructed with the STN ($Sr_2(Ta_{1-x}Nb_x)_2O_y$), x: 0<x<1, y: 0<y, and said insulation barrier layer is constructed by tantalum oxide ($Ta_2O_5$) according to any of the first invention and the second invention.

Dielectric constant of the STN is about 40 to 50, and dielectric constant of tantalum oxide is about 25. Therefore, voltage falling of tantalum oxide itself is small, and it is possible to design decrease of leak current without falling largely voltage applied to the ferroelectric film. Furthermore, since said tantalum oxide includes tantalum being composition elements of the ferroelectric film, diffusion of tantalum from the ferroelectric film so as to obtain higher nonvolatile memory in reliability.

The fifth invention is characterized in that said ferroelectric film is constructed with the STN ($Sr_2(Ta_{1-x}Nb_x)_2O_y$), x: 0<x<1, y: 0<y, and said insulation barrier layer includes at least one oxide of composition elements of said ferroelectric film.

According to such the construction, there is not diffusion of composition elements from the insulation barrier layer to the ferroelectric film so as to obtain good memory characteristic.

The sixth invention is characterized in that said insulation barrier layer is constructed so as to satisfy the following expression when $t_{in}$ is placed for film thickness thereof, $\epsilon_{in}$ for dielectric constant, $t_f$ for film thickness of said ferroelectric film, and $\epsilon_f$ for dielectric constant of the ferroelectric film.

$$(\epsilon_f/t_f) < (\epsilon_{in}/t_{in}) < 2(\epsilon_f/t_f)$$

According to such the construction, voltage falling rate by standing of the insulation barrier layer is depressed ⅓ to ½, it is possible to insure voltage applied to the ferroelectric film largely enough. That is, voltage $V_{in}$ applied to the insulation barrier is expressed the following expression.

$$V_{in} = (C_f/C_{in} + Cf)/V \qquad (1)$$

Here, as $C_f = \epsilon_f/t_f$, $C_{in} = \epsilon_{in}/t_{in}$,
by substituting for $(\epsilon_f/t_f) < (\epsilon_{in}/t_{in}) < 2(\epsilon_f/t_f)$, the following expression is obtained, $$C_f < C_{in} < 2C_f$$

by substituting this expression for the above expression (1),
voltage applied to the insulation barrier becomes like the following expression.

$$\tfrac{1}{3}V < V_{in} < \tfrac{1}{2}V$$

The seventh invention is characterized in that band gap of said insulation barrier layer is larger than band gap of the ferroelectric film.

The eighth invention is characterized in that said insulation barrier layer includes oxide or nitride of composition elements of said ferroelectric film.

In the ninth invention, said insulation barrier layer is a tantalum oxide layer.

In the tenth invention, said insulation barrier layer is a titanium oxide layer.

In the eleventh invention, said insulation barrier layer is titanium, tantalum, zirconium, tungsten, or nitride of these substances.

In the twelfth invention, said insulation barrier layer is nitride of matter including aluminum, silicon, and the like in nitride of high melting point such as TaAlN, TaSiN, and the like.

In the thirteenth invention, said floating gate is two layers film of iridium layer and iridium oxide layer.

In the fourteenth invention, said control gate is two layers film of iridium layer and iridium oxide layer.

The fifteenth invention, said floating gate of two layers film of iridium layer and iridium oxide layer is formed on surface of a semiconductor substrate.

As described above, it is possible to use oxide of high melting point metal such as titanium (Ti), tantalum (Ta), zirconium (Zr), tungsten (W), and so on, oxide nitride of the high melting point metal, or film including them for an insulation barrier.

Titanium oxide is good in adhesion with electrode metal such as iridium, iridium oxide, platinum, ruthenium, and so on, and adhesion between a floating gate or a control gate and a ferroelectric layer can be improved. When iridium (Ir) is included for the control gate, oxygen, lead (Pb), and zirconium (Zr) in PZT do not get out of the PZT especially, and there are not aging and change of repeating of polarization inversion so as to keep good ferroelectricity. Further, it is effective especially when the control gate includes two layers structure film of iridium and iridium oxide.

Moreover, said high melting point metal or said nitride of high melting point metal is formed after forming process of the ferroelectric layer, and by oxidizing this, the insulation barrier may be formed. For example, when the ferroelectric film is formed Sol-Gel method, titanium is formed thin by method such as spattering before annealing process, and both may be oxidized at the same time in the annealing process. Although annealing temperature at forming the ferroelectric film by Sol-Gel method is about 400° C., after that, by raising the temperature to about 700° C. in oxygen atmosphere in the chamber as it is, baking process and annealing process of the ferroelectric film are carried out continuously effectively so as to form good titanium oxide film. Titanium becomes titanium oxide by the annealing process so as to have a structure with an excellent barrier.

According to such the construction, it is possible to form very easily an insulation barrier layer having high barrier effect in reliability.

Iridium is material enabling to keep orientation of the ferroelectric film formed on the upper layer thereof good. On the other hand, there is a problem that iridium is columnar polycrystal and high in permeability, that is, a problem to permeate oxygen in the ferroelectric film and another elements. However, a dense insulation barrier layer consisting of titanium oxide of the lower layer can obtain strong barrier effect.

Further, since the titanium oxide layer is very dense, high in barrier performance, and dielectric constant is large, about 80 to 100. Therefore, voltage falling ratio is low and it is possible to keep characteristic for long time.

Dielectric constant of tantalum oxide is about 20 to 30. Dielectric constant of zirconium is about 12.5.

BRIEF DESCRIPTIONS OF THE DRAWINGS

FIGS. 3(a)–3(e) are views showing processes for manufacturing a ferroelectric memory of the second embodiment of the invention.

Figure 4:
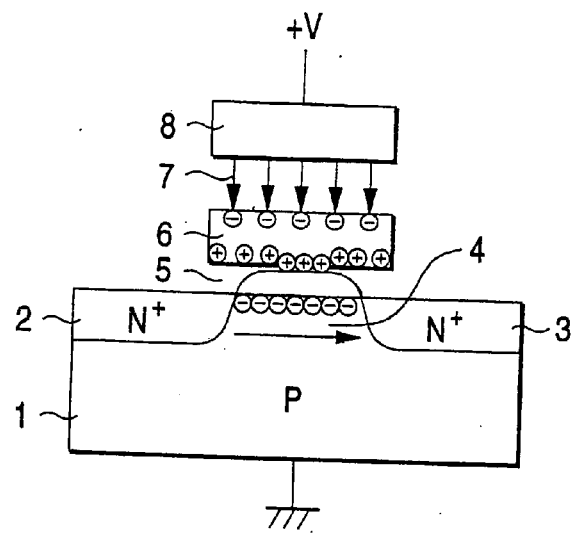
Figure 4:
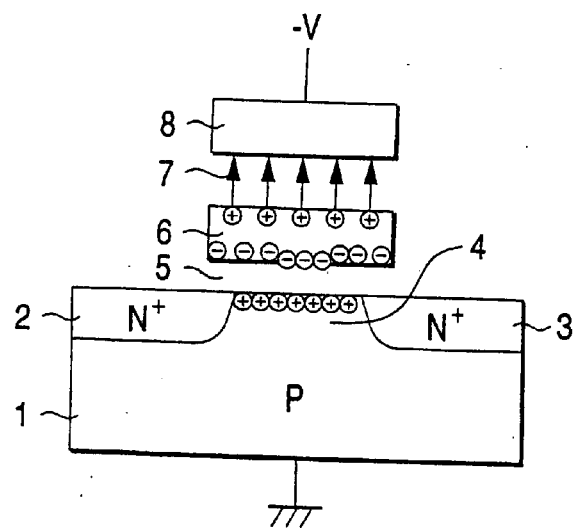

FIGS. 4(a)–4(b) are is views showing a conventional ferroelectric memory.

Figure 5:
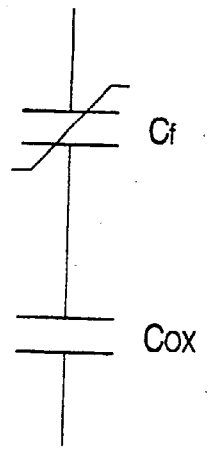

FIG. 5 is an equivalent circuit of capacitor part of a ferroelectric memory.

In symbols of figures, 1 is a silicon substrate, 2 is a source domain, 3 is a drain domain, 4 is a channel domain, 5 is a gate insulation film, 6 is a floating gate, 7 is a ferroelectric film, 8 is a control gate, and 10 is an insulation barrier layer.

BEST MODE FOR CARRYING OUT THE INVENTION

Figure 1:
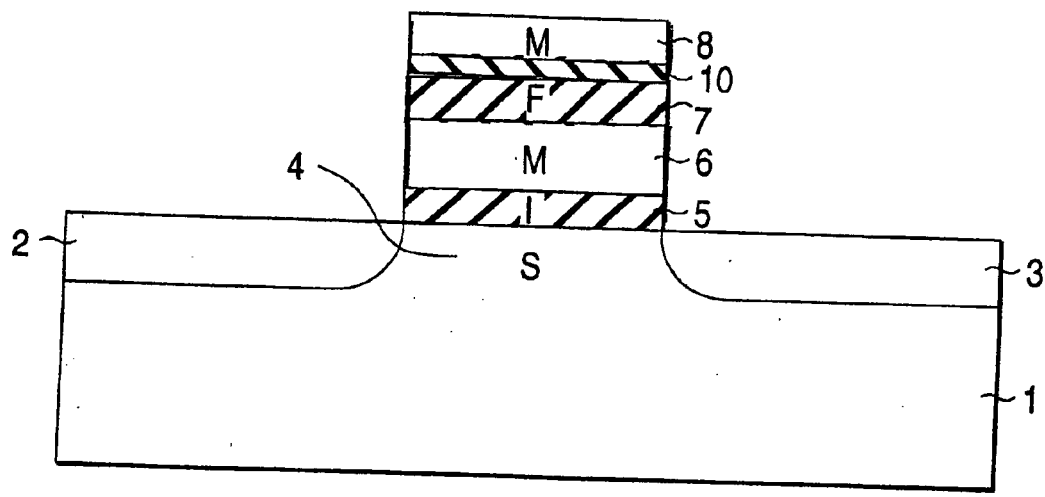
FIG. 1 is a view showing a ferroelectric memory of a first embodiment of the invention.

As an embodiment of the invention, a ferroelectric memory using STN for a ferroelectric film will be described below. The ferroelectric memory is FET having MFMIS structure laminating in order a floating gate 6 consisting of iridium layer of film thickness 100 nm, an ferroelectric layer 7 consisting of an STN of film thickness 150 nm, and a control gate 8 consisting of Pt of film thickness 200 nm on surface of a channel domain 4 between source-drain domains 2 and 3 consisting of p type impurity domain formed on surface of n type silicon substrate 1 through a gate insulation film 5 consisting of silicon oxide film of film thickness 10 nm as shown in FIG. 1. The ferroelectric memory is characterized by having an insulation barrier layer 10 consisting of tantalum oxide between said control gate 8 and the ferroelectric layer 7.

Although dielectric constant of the STN constructing the ferroelectric film is ranged from about 40 to 50, dielectric constant of tantalum oxide is large, about 25. Therefore, leakage current is low, voltage falling is decreased about 10% so as to keep voltage applying to the ferroelectric film large enough.

Here, the insulation barrier layer is constructed so as to satisfy the following expression where $t_{in}$, is placed for film thickness and $\epsilon_{in}$ for relative dielectric constant of respective thereof, while $t_f$ and $\epsilon_f$ are corresponding to thickness and relative dielectric constant of the ferroelectric film respectively.

$$(\epsilon_f/t_f)<(\epsilon_{in}/t_{in})<2(\epsilon_f/t_f)$$

Since the insulation barrier layer includes tantalum which is constitution element of STN of the ferroelectric film, adhesive is good and no separation occurs so as to provide FERAM of high reliability. Further, diffusion of tantalum from the ferroelectric film can be prevented and it is possible to obtain high nonvolatile memory of high reliability.

Although the STN is used for the ferroelectric film in said embodiment, such a material can be suitably modified without its limitation.

Although said ferroelectric film is constructed with the STN, at least a part of surface layer thereof maybe constructed with a composition inclination layer in which y changes continuously. That is, the ferroelectric film is constructed with the STN ($Sr_2(Ta_{1-x}Nb_x)_2O_y$), x: 0<x<1, y: 0<y, and said insulation barrier layer might be constructed with tantalum oxide.

According to such the construction, stress does not occur and it good memory characteristic can be achieved because of continuous composition change, and insulation performance becomes also high.

Figure 2:
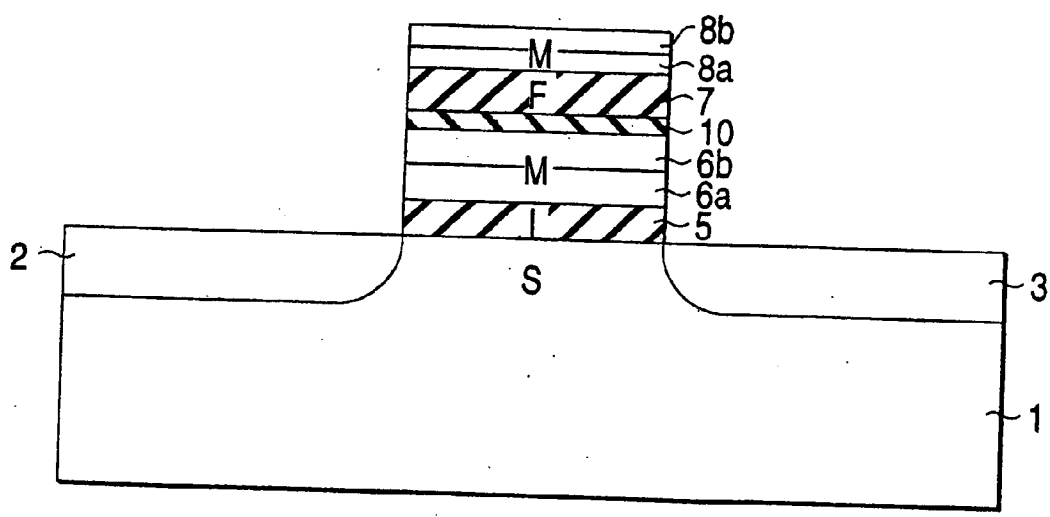
FIG. 2 is a view showing a ferroelectric memory of a second embodiment of the invention.

Although the insulation barrier layer is formed between the ferroelectric film 7 and the control gate 8 in said embodiment, the insulation barrier layer might be also formed between the floating gate 6 and the ferroelectric film 7 as shown in FIG. 2. This construction is characterized in that the floating gate 6 has the two-layers film being constructed by iridium and iridium oxide, on the upper layer thereof, thin titanium oxide layer 10 is formed, on the upper layer thereof, the ferroelectric film consisting of PZT is formed, and further on the upper layer thereof, the control gate 8 consisting of two layers film of iridium 8a and iridium oxide 8b is formed.

That is, the embodiment is an FET having an MFMIS structure laminated on a surface of a channel domain 4 between source and drain domains (2, 3) consisting of p type impurity domain formed on surface of n type silicon substrate 1. Said order is such as a gate insulation film 5 consisting of silicon oxide film; a floating gate 6 consisting of two layers film of iridium layer 6a and iridium oxide 6b; a thin titanium oxide layer 10 as an insulation barrier; an ferroelectric layer 7 consisting of PZT on the upper layer; and a control gate 8. The embodiment is characterized by having said insulation barrier layer 10 between said floating gate 6 and the ferroelectric layer 7.

By using PZT for the ferroelectric film and using titanium oxide for the insulation barrier layer, leakage current is lowered, voltage falling is decreased so as to keep voltage applied to the ferroelectric film large enough.

Here, the insulation barrier layer is constructed so as to satisfy the following expression where $t_{in}$ is placed for film thickness and $\epsilon_{in}$ for relative dielectric constant of respective thereof, while $t_f$ and $\epsilon_f$ are corresponding to thickness and relative dielectric constant of the ferroelectric film respectively.

$$(\epsilon_f/t_f)<(\epsilon_{in}/t_{in})<2(\epsilon_f/t_f)$$

Next, manufacturing process of transistor having the MFMIS structure will be described. FIGS. 3(a) to 3(e) show the views of manufacturing processes.

First, after surface of the n type silicon substrate 1 is thermally oxidized and silicon oxide layer 5 of film thickness 600 nm, iridium layer serving a floating gate is formed on the silicon oxide layer 2 by a spattering method using iridium target. Next, thermal treatment of 800° C. for one minute in atmosphere of $O_2$ is carried out so as to form iridium oxide layer 6b on surface of iridium layer 6a. Here, although iridium layer has columnar polycrystal structure, iridium oxide layer is formed not only on the surface of iridium layer but between crystals of the columnar polycrystal.

Further on the upper layer thereof, titanium oxide layer 10 is formed for an insulation barrier layer. Thus, iridium layer 6a, iridium oxide layer 6b, and titanium oxide layer 10 are formed as shown in FIG. 3(b).

Next, a PZT film is formed on the titanium oxide layer 10 as an insulation barrier layer for the ferroelectric film 7. Mixed solution of $Pb(CH_3COO)_2 \cdot 3H_2O$, $Zr(t\text{-}OC_4H_9)_4$, and $Ti(I\text{-}OC_3H_7)_4$ is used as a starting material. After spin coating the mixed solution, temporary baking of 400° C., 30 minutes is carried out in dry air atmosphere by drying at 150° C. After repeating this five times, thermal treatment of more than 700° C. is carried out in $O_2$ atmosphere. Thus, the ferroelectric film 7 of 250 nm is formed. Here, in $PbZr_xTi_{1-x}O_3$, the PZT film is formed making x 0.52 (expressed with PZT (52/48) hereafter).

Further iridium layer 8a is formed on the ferroelectric film 7 by spattering. Next, thermal treatment of 800° C., one minute is carried out in $O_2$ atmosphere so as to form iridium oxide layer 8b on surface of the iridium layer 8a (FIG. 3(c)) The iridium layer 8a and the iridium oxide layer 8b are served as an upper electrode 8. Here, the electrode is formed so as to be thickness of 200 nm summing up thicknesses of the iridium layer 8a and the iridium oxide layer 8b. Thus, the ferroelectric capacitor is obtained.

Figure 3:
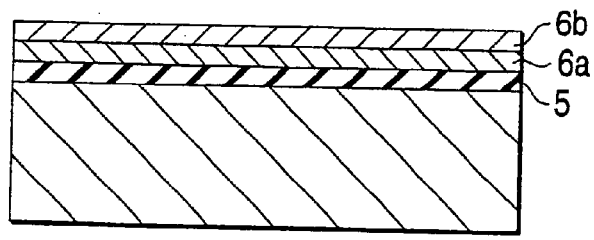
Figure 3:
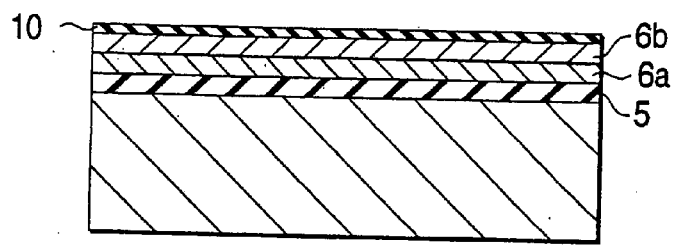
Figure 3:
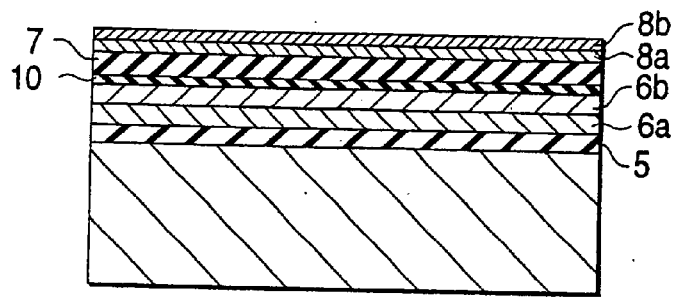
Figure 3:
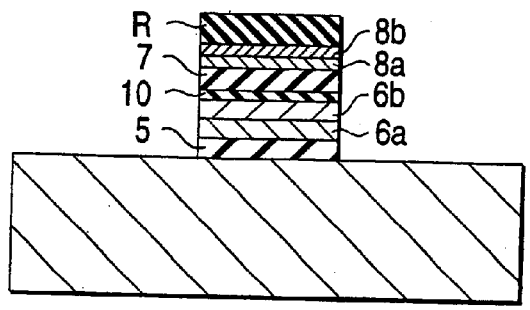
Figure 3:
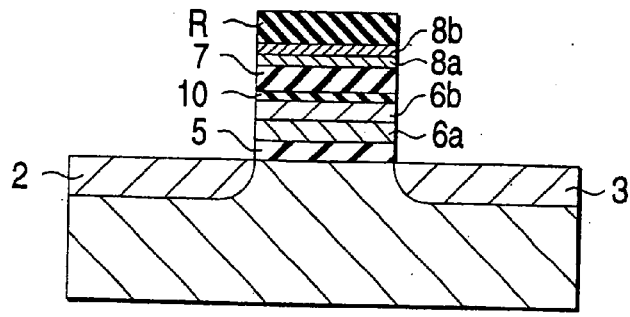

After that, by patterning this masking a resist pattern R formed by photolithography, surface of domain serving source drain is exposed as shown in FIG. 3(d).

After that, by injecting boron (B) ion masking the gate electrode pattern, source drain domains 2 and 3 consisting of p type diffusion layer are formed.

Further insulation film between layers and wiring pattern are formed so that the ferroelectric memory completes.

According to such the construction, since the insulation barrier layer is formed between the floating gate and the ferroelectric film, leakage current can be decreased, and since dielectric constant of titanium oxide is large enough to the ferroelectric film, it is possible to make voltage applying to the ferroelectric film large enough.

Further more, titanium oxide layer has an action as a junction layer. Adhesive of iridium and PZT film is not so good. Because of that, although iridium comes off partly, and there is the possibility of deteriorating ferroelectric characteristic, the titanium oxide layer is effective for action as a junction layer because the titanium is oxidized after good titanium layer in adhesive is formed in the embodiment. Thus, not only by decrease of leakage current but by improvement of adhesive, the ferroelectric characteristic is improved.

Although the titanium oxide layer is high in barrier effect because of a dense film thereof, the titanium oxide layer has an effect of preventing reduction. That is, although the titanium oxide layer is reduced and becomes iridium so as to lose oxygen barrier effect when the electrode is iridium oxide single layer for example, reduction is depressed by existence of the titanium oxide layer so as to keep the state of iridium oxide.

Although tantalum oxide and titanium oxide layer are used for the insulation barrier layer in the above-mentioned embodiment, any other modification is also possible by selecting suitable material without limitation. Titanium, tantalum, zirconium, tungsten, or nitride of these materials, further oxide of substance of nitride of high melting point metal such as TaAlN, TaSiN, possibly containing aluminum or silicon in it.

Although STN and PZT are used for the ferroelectric film in each above-mentioned embodiment, it is possible to apply for ferroelectrics such as SBT or high dielectric constant dielectric film such as BST.

INDUSTRIAL APPLICABILITY

As described above, according to the invention, it is possible to design decrease of leakage current and to obtain a high ferroelectric memory in reliability.

What is claimed is:

1. A nonvolatile memory, comprising:
   an FET having MFMIS structure laminating in order of a floating gate, a ferroelectric layer, and a control gate on a surface of a semiconductor substrate through a gate insulation film which is provided between source/drain domains formed on the surface of the semiconductor substrate,
   wherein an insulation barrier layer stands between said ferroelectric layer and any one of said floating gate and said control gate,
   wherein a reading or a writing operation in the nonvolatile memory is performed by measuring a change in a resistance caused by a spontaneous polarization in the ferroelectric layer, and
   wherein a band gap of said insulation barrier layer is larger than a band gap of said ferroelectric layer.

2. A nonvolatile memory according to claim 1,
   wherein said insulation barrier layer comprises insulation material including composition elements of said ferroelectric layer.

3. A nonvolatile memory according to any of claim 1 and claim 2,
   wherein said insulation barrier layer stands between said ferroelectric layer and said control gate.

4. A nonvolatile memory according to any of claim 1 and claim 2,
   wherein said insulation barrier layer stands between said floating gate and said ferroelectric layer.

5. A nonvolatile memory according to any of claim 1 and claim 2,
   wherein said ferroelectric layer is constructed with STN ($Sr_2(Ta_{1-x}Nb_x)_2O_y$), x: 0<x<1, y: 0<y, and said insulation barrier layer includes at least one oxide of composition elements of said ferroelectric layer.

6. A nonvolatile memory according to any of claim 1 and claim 2,
   wherein said insulation barrier layer is constructed so as to satisfy the following expression when $t_{in}$ is placed for film thickness thereof, $\epsilon_{in}$ for dielectric constant, $t_f$ for film thickness of said ferroelectric layer, and $\epsilon_f$ for dielectric constant of the ferroelectric layer $$(\epsilon_f/t_f)<(\epsilon_{in}/t_{in})<2(\epsilon_f/t_f).$$

7. A nonvolatile memory according to any of claim 1 and claim 2,
   when said insulation barrier layer includes oxide or nitride of composition elements of said ferroelectric layer.

8. A nonvolatile memory according to any of claim 1 and claim 2,
   wherein said insulation barrier layer is a tantalum oxide layer.

9. A nonvolatile memory according to any of claim 1 and claim 2,
   wherein said insulation barrier layer is a titanium oxide layer.

10. A nonvolatile memory, comprising:
    an FET having MFMIS structure laminating in order of a floating gate, a ferroelectric layer, and a control gate on a surface of a semiconductor substrate through a gate insulation film which is provided between source/drain domains formed on the surface of the semiconductor substrate,
    wherein an insulation barrier layer stands between said ferroelectric layer and any one of said floating gate and said control gate,
    wherein a reading or a writing operation in the nonvolatile memory is performed by measuring a change in a resistance caused by a spontaneous polarization in the ferroelectric layer, wherein said insulation barrier layer comprises insulation material including composition elements of said ferroelectric layer, and wherein said floating gate of two layers film of iridium layer and iridium oxide layer is formed on the surface of the semiconductor substrate.

11. A nonvolatile memory according to any of claim 1 and claim 2, wherein said insulation barrier layer is nitride of matter including aluminum, silicon, and the like in nitride of high melting point such as TaAlN, TaSiN, and the like.

12. A nonvolatile memory according to any of claim 1 and claim 2, wherein said floating gate is two layers film of iridium layer and iridium oxide layer.

13. A nonvolatile memory according to any of claim 1 and claim 2, wherein said control gate is two layers film of iridium layer and iridium oxide layer.

14. A nonvolatile memory according to any of claim 1 and claim 2, wherein said floating gate of two layers film of iridium layer and iridium oxide layer is formed on the surface of the semiconductor substrate.

15. A nonvolatile memory, comprising:

an FET having MFMIS structure laminating in order of a floating gate, a ferroelectric layer, and a control gate on a surface of a semiconductor substrate through a gate insulation film which is provided between source/drain domains formed on the surface of the semiconductor substrate, wherein an insulation barrier layer stands between said ferroelectric layer and any one of said floating gate and said control gate, wherein a reading or a writing operation in the nonvolatile memory is performed by measuring a change in a resistance caused by a spontaneous polarization in the ferroelectric layer, and wherein said ferroelectric layer is constructed with STN $(Sr_2(Ta_{1-x}Nb_x)_2O_y)$, x: 0<x<1, y: 0<y, and said insulation barrier layer includes at least one oxide of composition elements of said ferroelectric layer.

16. The nonvolatile memory of claim 15, wherein said insulation barrier layer comprises insulation material including composition elements of said ferroelectric layer.

17. A nonvolatile memory, comprising:

an FET having MFMIS structure laminating in order of a floating gate, a ferroelectric film, and a control gate on a surface of a semiconductor substrate through a gate insulation film which is provided between source/drain domains formed on the surface of the semiconductor substrate, wherein an insulation barrier layer stands between said ferroelectric film and any one of said floating gate and said control gate, wherein a reading or a writing operation in the nonvolatile memory is performed by measuring a change in a resistance caused by a spontaneous polarization in the ferroelectric film, and wherein said insulation barrier layer is constructed so as to satisfy the following expression when $t_{in}$ is placed for film thickness thereof, $\epsilon_{in}$ for dielectric constant, $t_f$ for film thickness of said ferroelectric film, and $\epsilon_f$ for dielectric constant of the ferroelectric film $$(\epsilon_f/t_f)<(\epsilon_{in}/t_{in})<2(\epsilon_f/t_f).$$

18. The nonvolatile memory of claim 17, wherein said insulation barrier layer comprises insulation material including composition elements of said ferroelectric film.

19. A nonvolatile memory, comprising:

an FET having MFMIS structure laminating in order of a floating gate, a ferroelectric layer, and a control gate on a surface of a semiconductor substrate through a gate insulation film which is provided between source/drain domains formed on the surface of the semiconductor substrate, wherein an insulation barrier layer stands between said ferroelectric layer and any one of said floating gate and said control gate, wherein a reading or a writing operation in the nonvolatile memory is performed by measuring a change in a resistance caused by a spontaneous polarization in the ferroelectric layer, wherein said insulation barrier layer comprises insulation material including composition elements of said ferroelectric layer, and wherein said insulation barrier layer is nitride of matter including aluminum, silicon, and the like in nitride of high melting point such as TaAlN, TaSiN, and the like.

20. A nonvolatile memory, comprising:

an FET having MFMIS structure laminating in order of a floating gate, a ferroelectric layer, and a control gate on a surface of a semiconductor substrate through a gate insulation film which is provided between source/drain domains formed on the surface of the semiconductor substrate, wherein an insulation barrier layer stands between said ferroelectric layer and any one of said floating gate and said control gate, wherein a reading or a writing operation in the nonvolatile memory is performed by measuring a change in a resistance caused by a spontaneous polarization in the ferroelectric layer, wherein said insulation barrier layer comprises insulation material including composition elements of said ferroelectric layer, and wherein said floating gate is two layers film of iridium layer and iridium oxide layer.

21. A nonvolatile memory, comprising:

an FET having MFMIS structure laminating in order of a floating gate, a ferroelectric layer, and a control gate on a surface of a semiconductor substrate through a gate insulation film which is provided between source/drain domains formed on the surface of the semiconductor substrate, wherein an insulation barrier layer stands between said ferroelectric layer and any one of said floating gate and said control gate, wherein a reading or a writing operation in the nonvolatile memory is performed by measuring a change in a resistance caused by a spontaneous polarization in the ferroelectric layer, wherein said insulation barrier layer comprises insulation material including composition elements of said ferroelectric layer, and wherein said control gate is two layers film of iridium layer and iridium oxide layer.

* * * * *